(12) United States Patent
Park et al.

(10) Patent No.: US 12,248,028 B2
(45) Date of Patent: Mar. 11, 2025

(54) METHOD OF PREDICTING LIFESPAN OF BATTERY CELL REFLECTING STORAGE CHARACTERISTICS OF POSITIVE ELECTRODE ACTIVE MATERIAL

(71) Applicant: LG ENERGY SOLUTION, LTD., Seoul (KR)

(72) Inventors: Su Han Park, Daejeon (KR); Sung Hoon Bae, Daejeon (KR); Dae Sik Chung, Daejeon (KR); Young Hwan Lee, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 326 days.

(21) Appl. No.: 17/800,030

(22) PCT Filed: Aug. 17, 2021

(86) PCT No.: PCT/KR2021/010889
§ 371 (c)(1),
(2) Date: Aug. 16, 2022

(87) PCT Pub. No.: WO2022/039473
PCT Pub. Date: Feb. 24, 2022

(65) Prior Publication Data
US 2023/0341468 A1 Oct. 26, 2023

(30) Foreign Application Priority Data
Aug. 21, 2020 (KR) .................. 10-2020-0105113

(51) Int. Cl.
*G01R 31/392* (2019.01)
*G01R 31/367* (2019.01)
(Continued)

(52) U.S. Cl.
CPC ......... *G01R 31/392* (2019.01); *G01R 31/367* (2019.01); *G01R 31/396* (2019.01);
(Continued)

(58) Field of Classification Search
CPC .. G01R 31/392; G01R 31/367; G01R 31/396; H01M 10/44; H01M 10/48; H01M 2010/4271
See application file for complete search history.

(56) References Cited

U.S. PATENT DOCUMENTS

| | | | |
|---|---|---|---|
| 2013/0071748 A1* | 3/2013 | Okada | H01M 4/485 429/231.95 |
| 2016/0011274 A1* | 1/2016 | Morita | G01R 31/392 702/63 |

(Continued)

FOREIGN PATENT DOCUMENTS

| | | |
|---|---|---|
| EP | 2963433 A1 | 1/2016 |
| JP | 2008-217075 A | 9/2008 |

(Continued)

OTHER PUBLICATIONS

Extended European Search Report dated May 25, 2023 issued in corresponding European Patent Application No. 21858560.2.
(Continued)

*Primary Examiner* — Ricky Go
(74) *Attorney, Agent, or Firm* — MORGAN, LEWIS & BOCKIUS LLP (57) ABSTRACT

A method for predicting a lifespan of a battery cell of the present invention includes: virtually dividing a capacity of a battery cell, which is a measurement object for lifespan prediction, into two or more capacity parts, and measuring charge and discharge cycle data for each of the capacity parts; correcting the charge and discharge cycle data by reflecting storage degeneration a positive electrode active material; and predicting a lifespan of the battery cell, based on the corrected charge and discharge cycle data.

9 Claims, 10 Drawing Sheets

(51) Int. Cl.
*G01R 31/396* (2019.01)
*H01M 10/42* (2006.01)
*H01M 10/44* (2006.01)
*H01M 10/48* (2006.01)

(52) U.S. Cl.
CPC ......... *H01M 10/425* (2013.01); *H01M 10/44* (2013.01); *H01M 10/48* (2013.01); *H01M 2010/4271* (2013.01)

(56) References Cited

U.S. PATENT DOCUMENTS

| | | | |
|---|---|---|---|
| 2017/0190258 A1* | 7/2017 | Hashimoto | B60L 58/15 |
| 2019/0293720 A1* | 9/2019 | Fujita | G01R 31/392 |
| 2020/0161651 A1 | 5/2020 | Sun et al. | |

FOREIGN PATENT DOCUMENTS

| | | |
|---|---|---|
| JP | 4817647 B2 | 11/2011 |
| JP | 2020-514680 A | 5/2020 |
| KR | 10-1684092 B1 | 12/2016 |
| KR | 10-2017-0022746 A | 3/2017 |
| KR | 10-1894131 B1 | 8/2018 |
| KR | 10-1903225 B1 | 9/2018 |
| KR | 10-1927538 B1 | 12/2018 |
| KR | 2019-0005406 A | 1/2019 |
| KR | 10-2013306 B1 | 8/2019 |
| KR | 10-2019-0106763 A | 9/2019 |
| KR | 10-2020-0056716 A | 5/2020 |

OTHER PUBLICATIONS

International Search Report (with translation) and Written Opinion dated Nov. 30, 2021 issued in corresponding International Patent Application No. PCT/KR2021/010889.

* cited by examiner

METHOD OF PREDICTING LIFESPAN OF BATTERY CELL REFLECTING STORAGE CHARACTERISTICS OF POSITIVE ELECTRODE ACTIVE MATERIAL

TECHNICAL FIELD

This application claims the benefit of priority based on Korean Patent Application No. 10-2020-0105113, filed on Aug. 21, 2020, and the entire contents of the Korean patent application are incorporated herein by reference.

The present invention relates to a battery cell lifespan prediction method reflecting storage characteristics of a positive electrode active material. Specifically, the present invention relates to a battery cell lifespan prediction method which has removed the influence of calendar degeneration (storage degeneration) due to storage characteristics in consideration of error generation by storage characteristics according to the type of a positive electrode active material in a section division accelerated lifespan evaluation method which quickly predicts the lifespan of a battery by dividing the capacity of the battery into a plurality of capacity parts.

BACKGROUND ART

As portable electronic devices such as a notebook computer, a video camera, and a mobile phone are widely used, the importance of the secondary battery, which is mainly used as the actuating power, is on the increase.

Generally, a secondary battery has a structure where an electrode assembly is sealed with an electrolyte in an exterior material, and two electrode terminals having different polarities are exposed to the outside. The electrode assembly includes a plurality of unit cells, and the unit cell has a structure where a porous separator is interposed between a negative electrode plate and a positive electrode plate. Active materials participating in electrochemical reaction have been coated on the negative electrode plate and the positive electrode plate, and secondary batteries are charged or discharged according to the electrochemical reaction of the active material and the evaporate.

Further, the importance on the technology about a management system for efficiently using and managing secondary batteries is on the increase. In particular, the management system should be able to accurately predict the state of health (SOH) of the secondary battery in order to appropriately adjust the charge or discharge output and SOC (state of charge) use strategy of a secondary battery.

Generally, in order to predict the lifespan of the secondary battery, charge/discharge experiment data of about 4000 or more cycles are necessary. Conventionally, in the actual operating conditions, the lifespan experiment was carried out while charging the entire battery capacity. If such experiments are carried out, only 4 to 5 cycle data can be obtained at a time. Hence, in order to obtain about 4000 charge/discharge experiment data, it took about 900 days.

Hence, according to the above-described conventional method, it took about 30 months to obtain experiment data for predicting the lifespan of lithium secondary battery cells.

In order to solve the problem, Korean Patent Publication No. 10-2019-0106763 discloses a N-division accelerated lifespan evaluation method for predicting the lifespan of the battery cell by dividing a battery cell into a plurality of capacity parts, obtaining charge and discharge cycle data for respective capacity parts, and adding the obtained data. Herein, the disclosed technology significantly reduced time that takes in the battery cell lifespan evaluation, but it did not reflect storage characteristics according to the type of the positive electrode active material.

Further, FIGS. 1(a) to 1(c) show the capacity retention rate for each SOC according to the type of the positive electrode active material. Referring to the drawings, the battery cell of the positive electrode composition having relatively low nickel content shows high storage degeneration at a high SOC as shown in FIG. 1(a), but as shown in FIGS. 1(b) and 1(c), a reversed storage degeneration phenomenon is shown in SOC 75% or more. Namely, high storage degeneration is shown in a specific capacity section according to the composition of the positive electrode.

However, since the accelerated lifespan evaluation method of the prior art may show a distorted result due to the storage degeneration at a specific capacity section having a high nickel content, it is necessary to develop a technology for a battery cell lifespan prediction method capable of removing the degeneration degree by the storage degeneration.

DISCLOSURE

Technical Problem

The present invention is devised to solve the above problems, and an object of the present invention is to correct a distorted result by storage degeneration when evaluating the lifespan of a battery cell including a positive electrode material having been severely degenerated by storage degeneration, in consideration of the degree of the storage degeneration of the positive electrode active material, based on the conventional N-division accelerated lifespan evaluation method.

Technical Solution

A method for predicting a lifespan of a battery cell according to an embodiment of the present invention includes: virtually dividing a capacity of a battery cell, which is a measurement object for lifespan prediction, into two or more capacity parts, and measuring charge and discharge cycle data for each of the capacity parts; correcting the charge and discharge cycle data by reflecting storage degeneration a positive electrode active material; and predicting a lifespan of the battery cell, based on the corrected charge and discharge cycle data.

In an embodiment of the present invention, a process of obtaining the storage degeneration during the correcting of the charge and discharge cycle data includes: preparing actual battery cells as many as a double of a total number of the capacity parts; measuring a capacity according to storage time in a state that each of the actual battery cells is set to a predetermined voltage; and deriving storage degeneration for each of the capacity parts based on data obtained by the measurement.

In an embodiment of the present invention, the predetermined voltage is a voltage which is measured at an ending time point of a rest period after charging and discharging up to an upper limit capacity and a lower limit capacity for each capacity part.

In an embodiment of the present invention, the measuring of the charge and discharge cycle data for each capacity part includes: determining a number of parts into which the capacity of the battery cell, which is the measurement object, is to be virtually divided, and preparing battery cells, which are measurement objects, as many as the number of parts; and measuring charge and discharge cycle data of the battery cells corresponding to the respective capacity parts by repeatedly charging and discharging the battery cells, wherein during the determining of the number of parts and preparing of the battery cells, capacity parts of the battery cell, which is the measurement object, may be determined based on an output voltage to be matched to the divided parts.

In an embodiment of the present invention, during the determining of the number of parts and preparing of the battery cells, the capacity parts may overlap with each other by a predetermined amount in an adjacent range.

In an embodiment of the present invention, during the measuring of the charge and discharge cycle data, the battery cells corresponding to the respective capacity parts may be repeatedly charged and discharged, to thereby obtain charge and discharge cycle data of the battery cells.

In an embodiment of the present invention, a scheme of charging and discharging the battery cells includes:

In an embodiment of the present invention, determining a first reference voltage matched to an upper limit capacity among respective capacity parts corresponding to the battery cells; determining a second reference voltage matched to an lower limit capacity among respective capacity parts corresponding to the battery cells; measuring output voltages of the battery cells; comparing the output voltages with the first and second reference voltages; and determining whether to charge or discharge the battery cells based on a result of comparing the output voltages with the first and second reference voltages.

In an embodiment of the present invention, during the determining of whether to charge or discharge the battery cells, if the output voltage of the battery cell is equal to or less than the first reference voltage, charging is performed, and if the output voltage of the battery cell exceeds the first reference voltage, charging is stopped, and discharging is performed.

In an embodiment of the present invention, during the determining of whether to charge or discharge the battery cells, if the output voltage of the battery cell is equal to or greater than the second reference voltage, discharging is performed, and if the output voltage of the battery cell is less than the second reference voltage, discharging is stopped, and charging is performed.

In an embodiment of the present invention, during the predicting of the lifespan of the battery cell, the lifespan of the battery cell is predicted by using one of: a first scheme of predicting the lifespan of the battery cell by simply adding charge and discharge cycle data for respective capacity parts reflecting the storage degeneration; a second scheme of predicting the lifespan of the battery cell with a combination sum of charge and discharge cycle data for respective capacity parts reflecting the storage degeneration; and a third scheme of predicting the lifespan of the battery cell using multiplicative probabilities of charge and discharge cycle data for respective capacity parts reflecting the storage degeneration.

Advantageous Effects

According to the method of predicting the lifespan of a battery cell of the present invention, it is possible to reliably predict the lifespan by exempting the capacity reduction by storage degeneration when predicting the lifespan by the accelerated lifespan evaluation method.

Further, according to the present invention, it is possible to quickly predict the lifespan of the entire battery cell by dividing the capacity of a battery cell into a plurality of capacity parts and quickly collecting charge and discharge cycle data of the battery cell for respective capacity parts.

DETAILED DESCRIPTION OF THE PREFERRED EMBODIMENTS

Hereinafter, the present invention will be described in detail with reference to the drawings. The terms and words used in the present specification and claims should not be construed as limited to ordinary or dictionary terms and the inventor may properly define the concept of the terms in order to best describe its invention. The terms and words should be construed as meaning and concept consistent with the technical idea of the present invention.

In this application, it should be understood that terms such as "include" or "have" are intended to indicate that there is a feature, number, step, operation, component, part, or a combination thereof described on the specification, and they do not exclude in advance the possibility of the presence or addition of one or more other features or numbers, steps, operations, components, parts or combinations thereof.

In the present invention, after virtually dividing the entire capacity of a battery cell to be measured into a plurality of capacity parts, charge and discharge cycle data for respective capacity parts are obtained, and the lifespan of the battery cell is predicted by reflecting the storage degeneration according to the storage characteristics of the positive electrode active material, based on the obtained charge and discharge cycle data for respective capacity parts.

Figure 2:
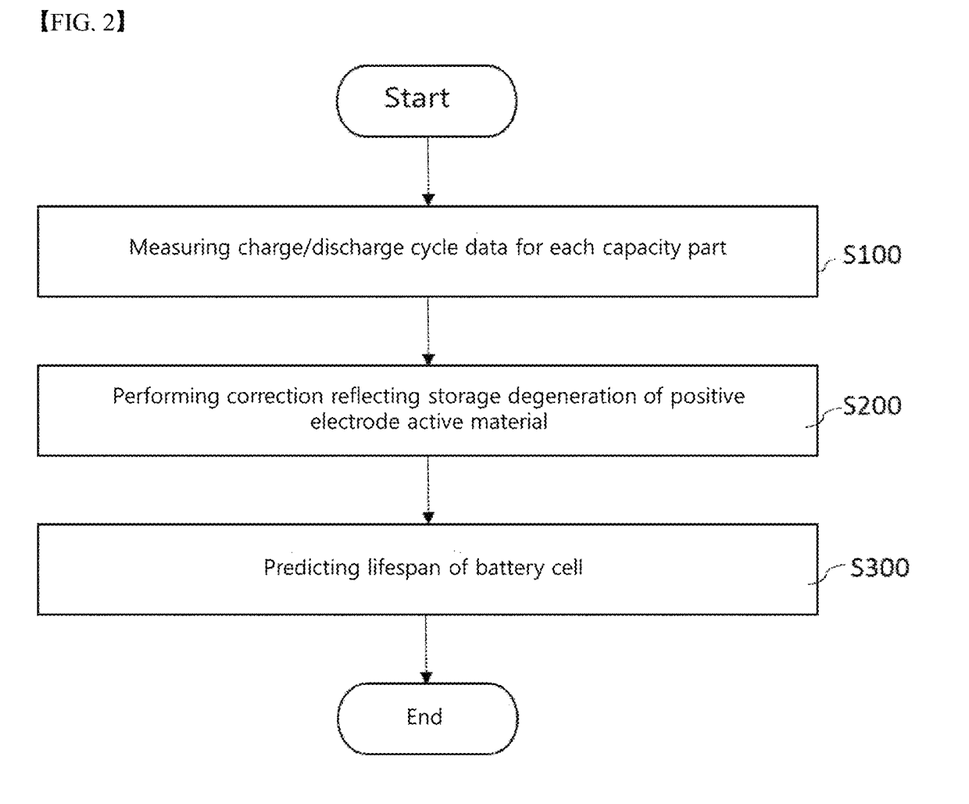
FIG. 2 is a flowchart of a lifespan prediction method of a battery cell according to an embodiment of the present invention.
Figure 3:
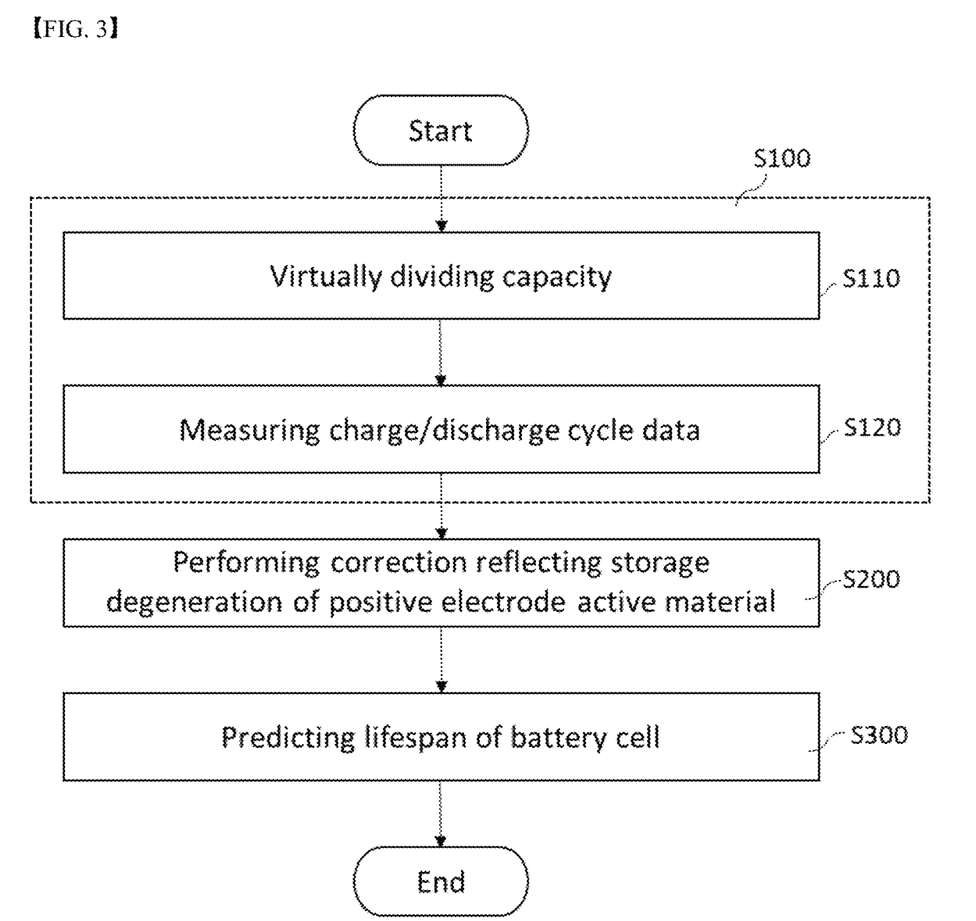
FIG. 3 is a flowchart of a lifespan prediction method of a battery cell according to an embodiment of the present invention.
Figure 4:
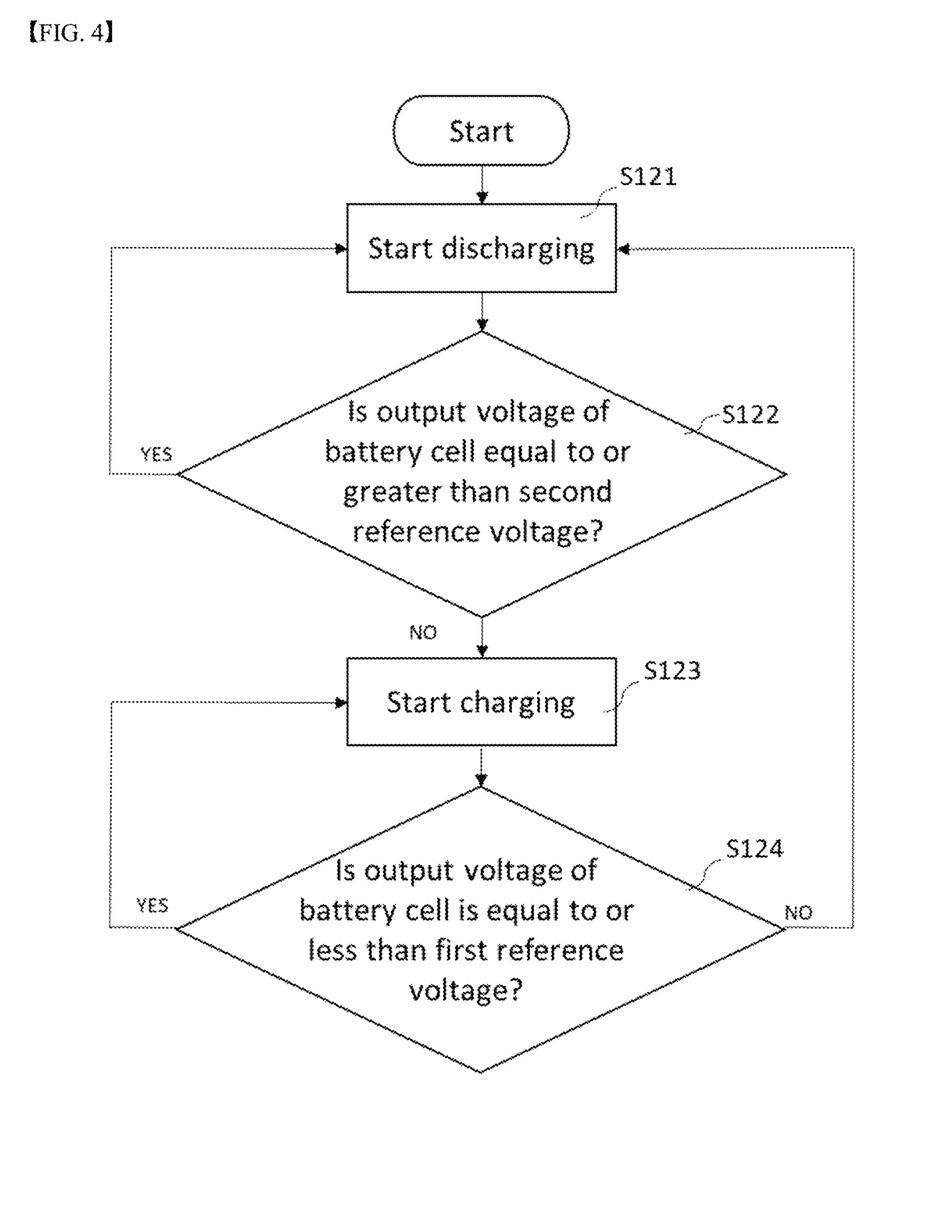
FIG. 4 is a flowchart illustrating a procedure for charging and discharging a battery cell within a predetermined capacity range according to an embodiment of the present invention.

FIGS. 2 to 4 are flowcharts of a lifespan prediction method of a battery cell according to an embodiment of the present invention. Referring to FIG. 2, a method for predicting a lifespan of a battery cell according to the present invention includes: virtually dividing a capacity of a battery cell, which is a measurement object for lifespan prediction, into two or more capacity parts, and measuring charge and discharge cycle data for each of the capacity parts (S100); correcting the charge and discharge cycle data by reflecting storage degeneration a positive electrode active material (S200); and predicting a lifespan of the battery cell, based on the corrected charge and discharge cycle data (S300).

Referring to FIG. 3, the measuring of the charge and discharge cycle data for each capacity part (S100) includes: determining the number of parts into which the capacity of the battery cell, which is the measurement object, is to be virtually divided, and preparing battery cells, which are measurement objects, as many as the number of parts (S110); and measuring charge and discharge cycle data of the battery cells corresponding to the respective capacity parts by repeatedly charging and discharging the battery cells (S120).

In the step of virtually dividing the capacity (S110), the entire capacity of the battery cell to be measured is virtually divided into two or more capacity parts, and battery cells to be used for measurement are prepared. The step (S110) may include a step of determining the number of capacity parts into which the entire capacity of the battery cell is to be divided (S111).

The step of determining the number of capacity parts is a step of determining the number of capacity parts into which the entire capacity of the battery cell is to be virtually divided. For example, if the entire capacity of the battery cell is 1 to 100, and the entire capacity of the battery cell is divided into 5 parts, each capacity part may have the capacity range of 20.

The step of virtually dividing the capacity (S110) includes preparing battery cells, which has the same specification as that of the battery cell that is the measurement object, as many as the number of capacity parts (S112). When the capacity of the battery cell, which is the measurement object, is virtually divided into 5 capacity parts, charge and discharge cycle data should be collected while charging and discharging each capacity part. Hence, 5 battery cells (first to fifth battery cells) having the same specification as that of the battery cell, which is the measurement object, are necessary. In other words, in order to obtain charge and discharge cycle data for the entire capacity while charging and discharging each divided capacity part, battery cells as many as the number of the capacity parts are necessary.

Herein, the charge and discharge cycle data may be capacity data of the battery cell after performing charge/discharge within the divided capacity part every time.

The capacity retention rate, which indicates the retention rate of the capacity at the initial state after performing charge/discharge for each capacity part, is obtained, and the lifespan of the battery can be predicted from the capacity retention rate. For example, in the case that it is assumed that the reference capacity retention rate to be judged as being in a deteriorated state or a state that requires replacement is 50%, if the calculated capacity retention rate is equal to or less than the reference capacity retention rate after performing 4000 charge/discharge cycles, the lifespan of the battery cell can be predicted as 4000 times of charge/discharge.

In a specific example, in the step of determining the number of capacity parts and preparing of the battery cells, the capacity parts may overlap with each other by a predetermined amount in an adjacent range.

The step of measuring charge and discharge cycle data (S120) is a step of measuring charge and discharge cycle data of battery cells corresponding to respective capacity parts by repeatedly charging and discharging the battery cells and is a step of obtaining charge and discharge cycle data while charging and discharging the battery cells prepared in the preparation step (S112).

In an embodiment of the present invention, the capacity was divided into 5 capacity parts, and 5 battery cells (first to fifth battery cells) corresponding to the 5 capacity parts were prepared. The first battery cell is set to perform charge/discharge within the capacity range of 81 to 100, and the capacity at every charge/discharge cycle for the capacity range of 81 to 100 is measured while charging and discharging the first battery cell. The second battery cell is set to perform charge/discharge within the capacity range of 61 to 80, and the capacity at every charge/discharge cycle for the capacity range of 61 to 80 is measured while charging and discharging the second battery cell. The third battery cell is set to perform charge/discharge within the capacity range of 41 to 60, and the capacity at every charge/discharge cycle for the capacity range of 41 to 60 is measured while charging and discharging the third battery cell. The fourth battery cell is set to perform charge/discharge within the capacity range of 21 to 40, and the capacity at every charge/discharge cycle for the capacity range of 21 to 40 is measured while charging and discharging the fourth battery cell. The fifth battery cell is set to perform charge/discharge within the capacity range of 1 to 20, and the capacity at every charge/discharge cycle for the capacity range of 1 to 20 is measured while charging and discharging the fifth battery cell.

In the measuring step (S120) of the present invention, a scheme of charging and discharging the battery cells includes: determining a first reference voltage matched to an upper limit capacity among respective capacity parts corresponding to the battery cells; determining a second reference voltage matched to an lower limit capacity among respective capacity parts corresponding to the battery cells; measuring output voltages of the battery cells; comparing the output voltages with the first and second reference voltages; and determining whether to charge or discharge the battery cells based on a result of comparing the output voltages with the first and second reference voltages.

For example, in the case of the second battery cell, the first reference voltage matched to the upper limit capacity 80 of the capacity range and the second reference voltage matched to the lower limit capacity 60 may be set. In one specific example, in the step of determining whether to charge or discharge the battery cells, as a result of the comparison step, if the output voltage of the battery cell, which is the measurement object, is equal to or less than the first reference voltage, charging is performed, and as a result of the comparison step, if the output voltage of the battery cell exceeds the first reference voltage, charging is stopped, and discharging is performed.

Further, in the step of determining whether to charge or discharge the battery cells, as a result of the comparison step, if the output voltage of the battery cell, which is the measurement object, is equal to or greater than the second reference voltage, discharging is performed, and as a result of the comparison step, if the output voltage of the battery cell is less than the second reference voltage, discharging is stopped, and charging is performed.

Hereinafter, a charge/discharge method will be described with reference to FIG. 5. Likewise, the method of measuring the capacity in every charge/discharge cycle of the second battery cell, where first and second reference voltages have been set, is performed as follows.

The first reference voltage is compared with the output voltage of the second battery cell (S124), and if the output voltage of the second battery cell is equal to or less than the first reference voltage, charging is continually performed (S123) and if the output voltage of the second battery cell exceeds the first reference voltage, charging is stopped and discharging is performed (S121). Further, the second reference voltage is compared with the output voltage of the second battery cell (S122), and if the output voltage of the second battery cell is equal to or greater than the second reference voltage, discharging is continually performed (S121), and if the output voltage of the second battery cell is less than the second reference voltage, discharging of the second battery cell is stopped, and charging is performed. In this way, the capacity at every charge/discharge cycle of the second battery cell can be measured while repeating charge/discharge within the capacity range of 61 to 80.

Further, in the above-described example, the ranges, by which the first to fifth battery cells are virtually divided, were set not to be overlapped with each other, but it is also possible to set the ranges to be partly overlapped with each other.

Namely, the first battery cell may be set to have the capacity range of 76 to 100, the second battery cell may be set to have the capacity range of 56 to 80, the third battery cell may be set to have the capacity range of 36 to 60, the fourth battery cell may be set to have the capacity range of 16 to 40, and the fifth battery cell may be set to have the capacity range of 1 to 25. At this time, the method of setting the capacity parts of first to fifth battery cells and measuring the capacity at respective charge/discharge cycles can be performed in the same method as the method of setting the capacity parts of first to fifth battery cells and the method of measuring the capacity at respective charge/discharge cycles when the virtual division ranges of the battery cell are not overlapped with each other.

Likewise, if the divided ranges are designed to be partly overlapped with each other, an error can be reduced by covering an error, which may be generated by the decrease of the used region of the negative electrode as degeneration in a specific section (e.g., section of SOC 60 to 40) is greater than that in others sections in the degeneration by sections of the battery cell, in another section.

Figure 5:
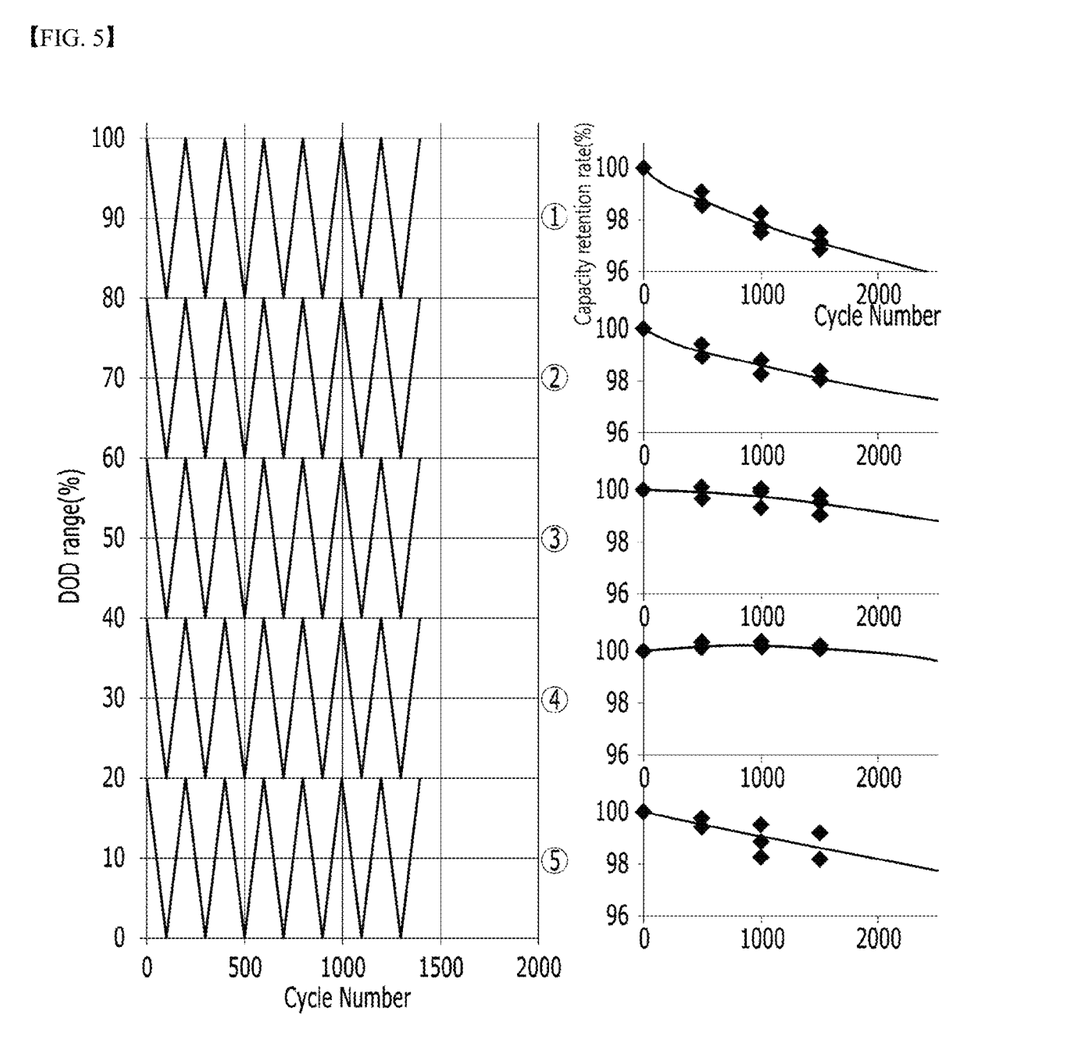
FIG. 5 shows a result of measuring charge/discharge cycles for 5 capacity parts after dividing each of battery cells, which are measurement objects, into the 5 capacity parts.

FIG. 5 shows the result of measuring charge and discharge cycle data for each capacity part by setting first to fifth battery cells to correspond to 5 divided capacity parts according to an embodiment of the present invention. Referring to FIG. 5, the left graph shows charging and discharging first to fifth battery cells according to divided capacity parts of the battery cell which is the measurement object, and 5 graphs on the right side show the capacity retention rate of the first to fifth battery cells.

Referring to graphs on the right side of FIG. 5, when charge/discharge was repeated, capacity retention rates were different for respective capacity parts. Likewise, since the capacity retention rate is different according to the capacity range, if the entire lifespan of a battery cell is predicted based on the capacity at charge/discharge cycles for only a part of the capacity range of the battery cell, there can be a significant error. Hence, according to the accelerated lifespan evaluation method of the present invention, the capacity at charge/discharge cycles for the entire capacity range of a battery cell is measured by setting respective capacity ranges for first to fifth battery cells to include the entire capacity of the battery cell.

The correction step (S200) is a step of performing correction by exempting the storage degeneration of the positive electrode active material in charge and discharge cycle data for the respective capacity parts.

Figure 1:
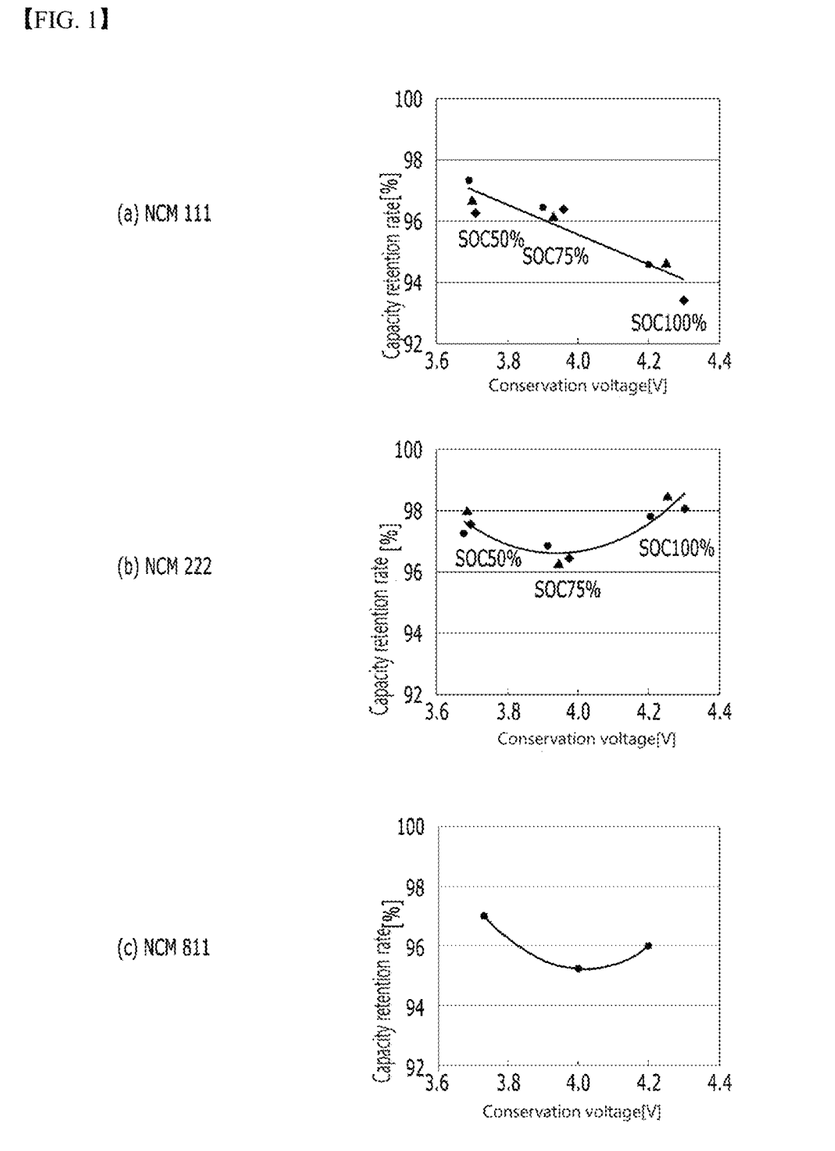
FIGS. 1(a) to 1(c) are graphs showing conservation voltage measurement values for respective SOCs according to positive electrode composition.

As shown in FIG. 1, storage degeneration significantly occurs in the SOC of a certain section, depending on the content of nickel contained in the positive electrode material. In the accelerated lifespan evaluation method of the present invention, entire capacity range of 0 to 100 is divided into n sections, and the lifespan of the battery cell is predicted based on charge and discharge cycle data obtained while repeatedly charging and discharging the battery cell for each capacity part. At this time, storage degeneration may vary depending on the capacity part, and the obtained charge and discharge cycle data reflects the storage degeneration as well as the cycle degeneration. Hence, it may be measured as a value lower than the actual capacity retention rate. Likewise, the lifespan prediction method of the present invention has significance in that the lifespan is predicted by reflecting only the cycle degeneration through performing correction by exempting the storage degeneration.

Figure 6:
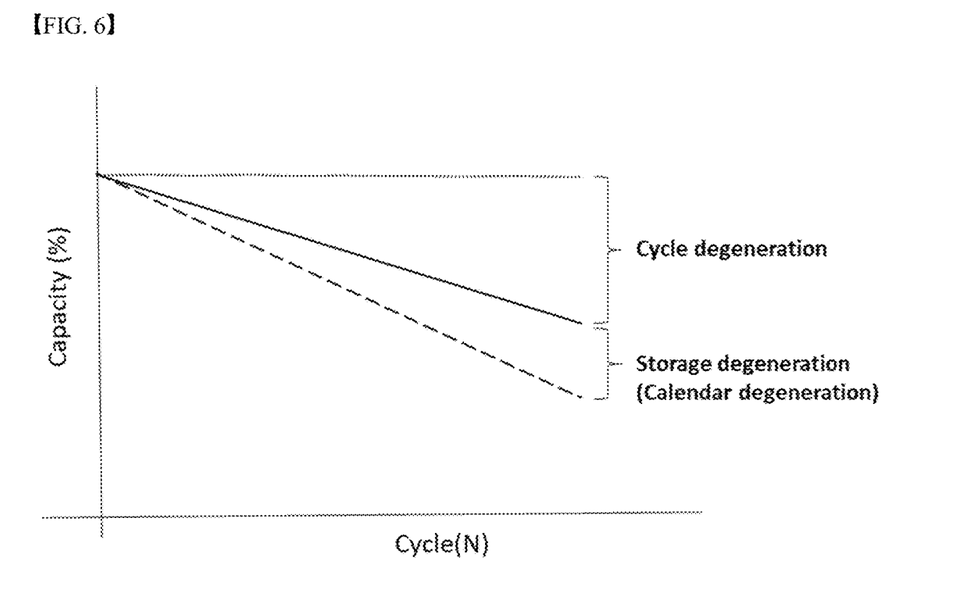
FIG. 6 is a schematic diagram of a lifespan prediction method of a battery cell of the present invention.

FIG. 6 is a schematic diagram of a lifetime prediction method of a battery cell of the present invention. The concept of the correction step of the present invention can be explained as follows reference to FIG. 6. The downward-sloping dotted line of FIG. 6 shows the capacity retention rate according to cycles by the N-division accelerated lifespan evaluation method calculated in the lifespan prediction step (S200) of the present invention, and the downward-sloping solid line of FIG. 6 shows the result corrected by the correction step (S300) of the present invention.

The degeneration of a lithium secondary battery can be divided into cycle degeneration and storage degeneration (calendar degeneration). The cycle degeneration means degeneration which occurs by irreversible degeneration of the electrolyte and active materials while operating ions (lithium ions in the case of a lithium battery) are intercalated or discharged from the electrode and Joule's heat is generated during the flow of charging or discharging current of the secondary battery. Herein, the storage degeneration (calendar degeneration) means degeneration occurring during a no load state, which is a state when the secondary battery is not currently charged or discharged, namely, in a calendar state. The capacity of the secondary battery can be reduced due to irreversible degeneration of the electrolyte and the active material coated on the electrode even in a no-load state. This is called storage degeneration or calendar degeneration as a term distinguished from cycle degeneration.

In the N-division accelerated lifespan evaluation method of the present invention, battery cells for n respective capacity parts are prepared, and charge and discharge cycle data are obtained while repeating charge/discharge. At this time, since there is a rest period after charge/discharge, storage degeneration occurs. Particularly, storage degeneration states are different in some SOC sections according to the composition of the positive electrode material, but since the conventional N-division accelerated lifespan evaluation method does not consider the capacity reduction by such storage degeneration, an error occurred. As such, in the present invention, the correction is made by exempting the storage degeneration as in FIG. 6.

Figure 7:
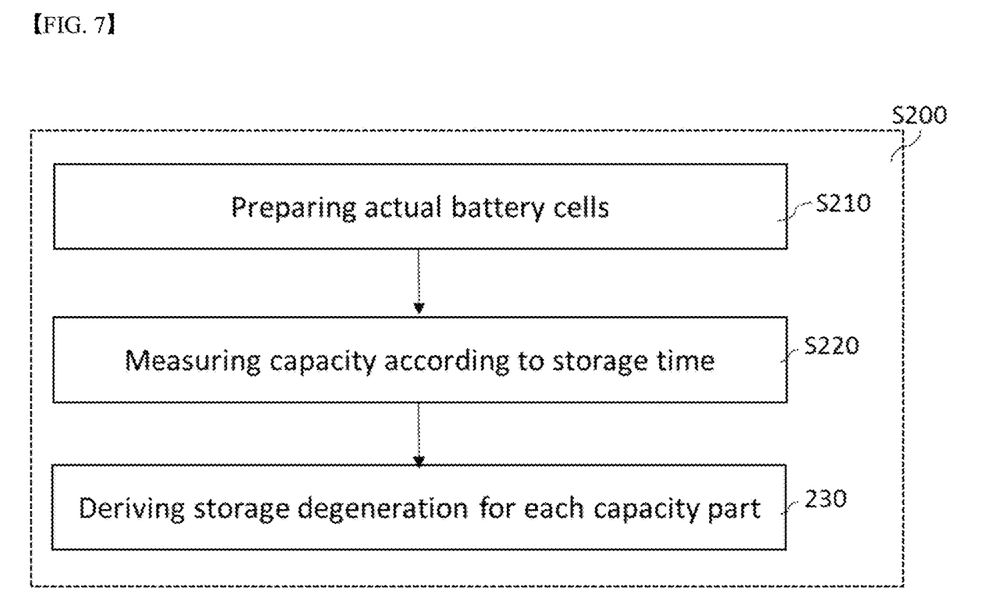
FIG. 7 is a flowchart of a correction step according to an embodiment of the present invention.

FIG. 7 shows a flowchart of correction steps that reflect the storage degeneration of the positive electrode active material according to an embodiment of the present invention. Referring to FIG. 7, a process of obtaining the storage degeneration during the correcting of the charge and discharge cycle data (S200) includes: preparing actual battery cells as many as a double of a total number of the capacity parts; measuring a capacity according to storage time in a state that each of the actual battery cells is set to a predetermined voltage; and deriving storage degeneration for each of the capacity parts based on data obtained by the measurement.

Referring to FIG. 7, the correction step (S200) of the present invention includes: preparing actual battery cells as many as a double of a total number of the capacity parts (S210); measuring a capacity according to storage time in a state that each of the actual battery cells is set to a predetermined voltage (S220); and deriving storage degeneration for each of the capacity parts based on data obtained by the measurement (S230). Herein, the predetermined voltage is a voltage which is measured at an ending time point of a rest period after charging and discharging up to an upper limit capacity and a lower limit capacity for each capacity part.

In one example, in the case that charge and discharge cycle data is obtained for each of 5 capacity parts by dividing the entire capacity into a total of 5 parts, 10 actual battery cells (first to tenth actual battery cells) corresponding to a double of 5 for calculation of the storage degeneration are prepared. Further, after charging each of the first to tenth actual battery cells, the capacity according to the storage time is measured. Herein, the predetermined voltage means a voltage which is measured at an ending time point of a rest period after charging and discharging up to an upper limit capacity and a lower limit capacity for each capacity part. Specifically, 10 actual battery cells are grouped by twos according to the capacity range. Thereafter, one battery cell of each group consisting of two battery cells is charged up to the upper limit capacity, and the capacity retention rate for each storage time in a state of a voltage measured at the ending time point of the rest period is measured, and the other battery cell of each group is charged up to the lower limit capacity, and the capacity retention rate for each storage time in a state of a voltage measured at the ending time point of the rest period is measured.

In a specific example, the capacity of the battery cell, which is the measurement object, is divided into a total of 5 capacity parts. Thereafter, the upper limit voltage of the first capacity part is set to 3.67V, and the lower limit voltage of the first capacity part is set to 3V. The upper limit voltage of the second capacity part is set to 3.73V, and the lower limit voltage of the second capacity part is set to 3.435V. The upper limit voltage of the third capacity part is set to 3.815V, and the lower limit voltage of the third capacity part is set to 3.536V. The upper limit voltage of the fourth capacity part is set to 3.962V, and the lower limit voltage of the fourth capacity part is set to 3.626V. The upper limit voltage of the fifth capacity part is set to 4.1V, and the lower limit voltage of the fifth capacity part is set to 3.754V. Thereafter, charge/discharge is repeated to obtain charge/discharge cycles. In this case, in the correction step of the present invention, for each of the 5 capacity parts, output voltages, which are measured at the ending time point of the rest period after charging up to the upper limit voltage, and output voltages, which are measured at the ending time point of the rest period after discharging up to the lower limit voltage, can be obtained, and the capacity retention rates of 10 actual battery cells are measured according to the storage time in a state that maintains the 10 output voltages. Table 1 shows the output voltage value according to the step of measuring the capacity according to the above-described storage time.

TABLE 1

| | Voltage range (V) | Division | Voltage after rest period (V) | Actual SOC (%) |
|---|---|---|---|---|
| First capacity part | 3~3.67 | Charge | 3.5917 | 28 |
| | | Discharge | 3.4075 | 5 |
| Second capacity part | 3.435~3.73 | Charge | 3.6385 | 41 |
| | | Discharge | 3.5383 | 19 |
| Third capacity part | 3.536~3.815 | Charge | 3.7163 | 59 |
| | | Discharge | 3.6264 | 37 |
| Fourth capacity part | 3.626~3.962 | Charge | 3.8755 | 76 |
| | | Discharge | 3.6955 | 56 |
| Fifth capacity part | 3.754~4.1 | Charge | 3.9907 | 90 |
| | | Discharge | 3.8378 | 71 |

Figure 8:
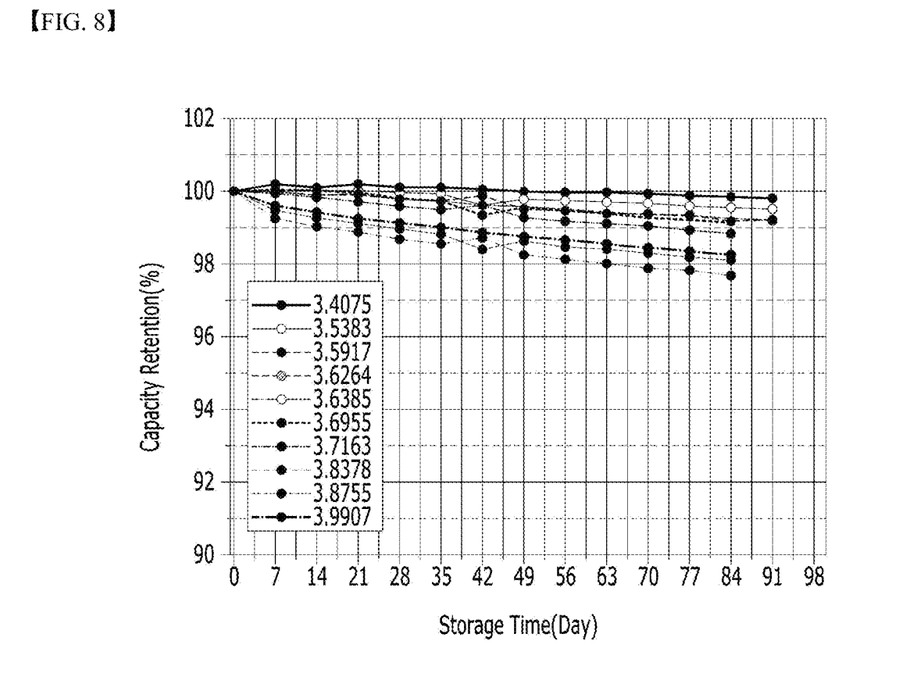
FIG. 8 is a graph showing a result of measuring capacities according to storage time after charging each battery cell with a predetermined voltage in order to derive the storage degeneration degree according to an embodiment of the present invention.

Further, FIG. 8 is a graph showing the capacity retention rate for each storage time in a state of a voltage measured in the ending time point of each rest period after charge and discharge for each capacity part, as shown in Table 1. Referring to FIG. 8, the storage degeneration was high in the voltage sections of 3.8755V (SOC 76%), 3.9907V (SOC 90%) and 3.8378V (SOC 71%).

Figure 9:
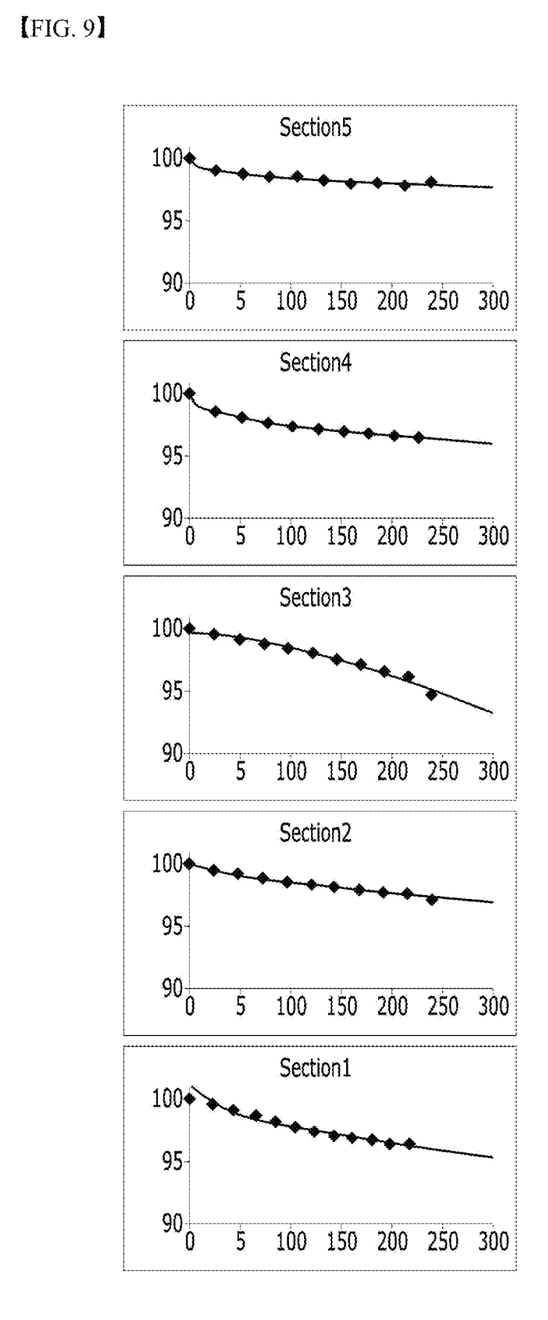
FIG. 9 is a graph corrected by reflecting the storage degeneration for each capacity part.

The storage degeneration for each capacity part can be calculated from the graph showing the capacity retention rate for each storage time of FIG. 8, and correction can be made by reflecting the calculated storage degeneration in the charge and discharge cycle data for each of the n capacity parts. FIG. 9 illustrates charge and discharge cycle data which has been corrected by reflecting the storage degeneration for each of the n capacity parts. Likewise, according to the present invention, it is possible to more accurately predict the lifespan of a battery because the effect by the storage degeneration accelerated in a specific section according to the characteristics of the positive electrode active material, based on charge and discharge cycle data for each capacity part.

Further, in the lifespan prediction step (S200) to be described later, it is possible to predict the entire lifespan of the battery cell based on the capacity in the charge/discharge cycle measured in the entire capacity range of first to fifth battery cells corrected as described above.

The lifespan prediction step (S200) of the present invention is a step of predicting the lifespan of a battery cell based on data corrected by reflecting the storage degeneration in charge and discharge cycle data measured in each of a plurality of battery cells having been set for each of the divided capacity parts.

In the present invention, the lifespan of the battery cell, which is the measurement object, is predicted based on charge and discharge cycle data measured in battery cells by respective capacity parts using three schemes.

First, the lifespan of a battery cell can be predicted by simply adding charge and discharge cycle data measured in a plurality of battery cells which are set as respective capacity parts.

Second, the lifespan of a battery cell can be predicted by simply calculating a combination sum of charge and discharge cycle data measured in a plurality of battery cells which are set as respective capacity parts.

Lastly, the lifespan of a battery cell can be predicted by using a multiplicative probability of charge and discharge cycle data measured in a plurality of battery cells which are set as respective capacity parts.

Figure 10:
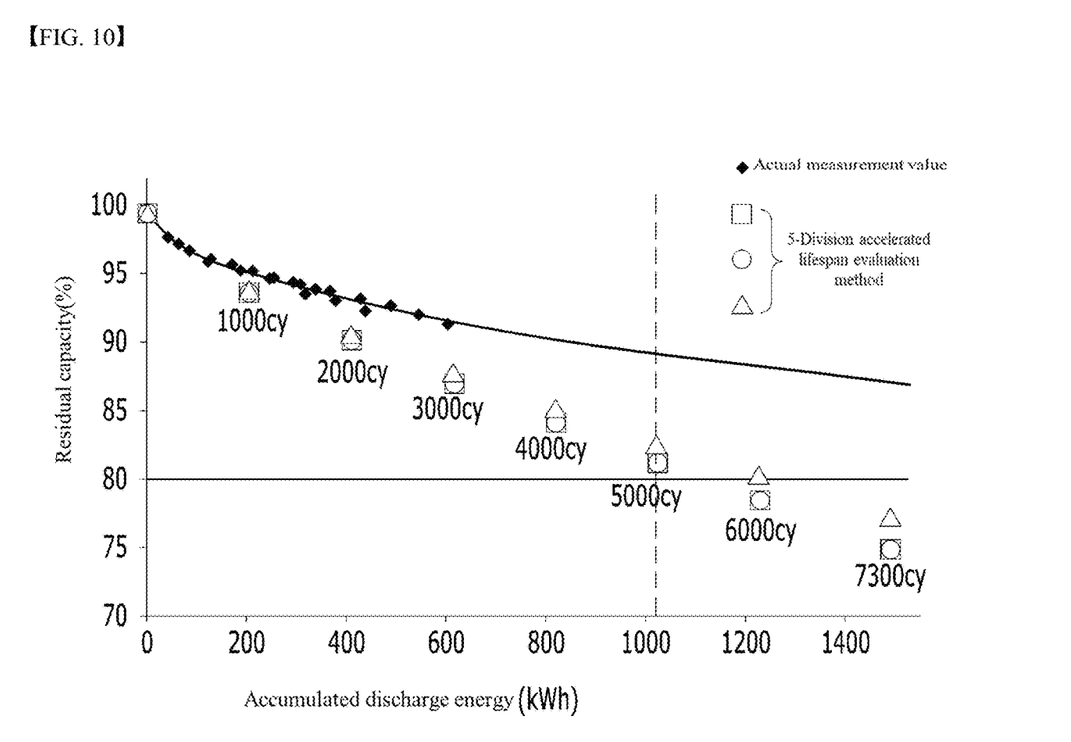
FIG. 10 is a graph of capacity retention rates according to the number of times of battery cycles predicted by a conventional 5-division accelerated lifespan evaluation method.
Figure 11:
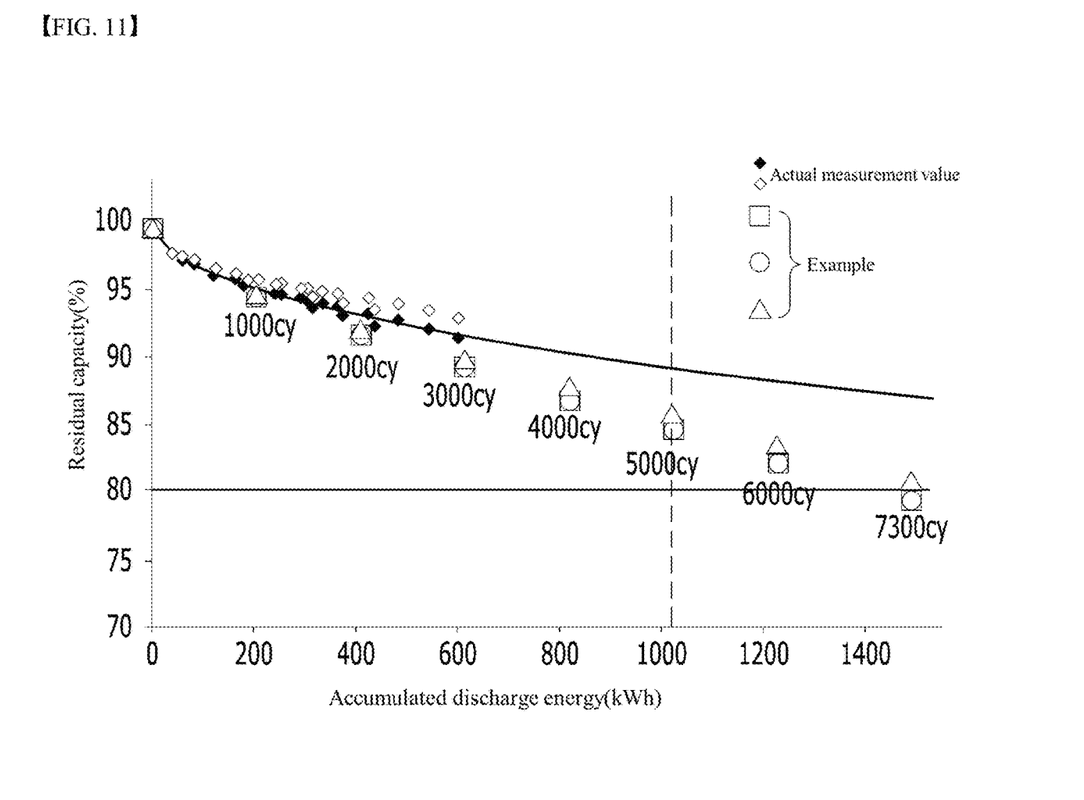
FIG. 11 is a graph of capacity retention rates according to the number of times of battery cycles predicted by reflecting the storage degeneration according to an embodiment of the present invention.

FIG. 10 is a graph showing residual capacities of a battery according to the cumulative discharge derived by the conventional N-division accelerated lifespan evaluation method (specifically 5-division accelerated lifespan evaluation method) for a battery of a high nickel positive electrode material (NCM811). FIG. 11 illustrates a graph corrected by reflecting the storage degeneration according to an embodiment of the present invention.

Referring to FIG. 10, according to the conventional N-division accelerated lifespan evaluation method, the battery is shown to have the residual capacity of 74.9 to 77.3% after 7300 cycles (accumulated discharge capacity is 1500 kwh). Further, the actual measurement value graph was predicted to have the residual capacity of 87.1% at 7300 cycles. Namely, the conventional N-division accelerated lifespan evaluation method has the error in the range of 9.8 to 12.3% on the basis of 7300 cycles.

Referring to FIG. 11, the battery is shown to have the residual capacity of 79.2 to 80.9% at 7300 cycles according to the prediction of the present invention. This shows an error of 6.2 to 7.9%, compared to 87.1% which is the residual capacity prediction value in the actual measurement value graph. Herein, since the influence by the storage degeneration accelerated in a specific capacity section has been exempted, it has further approached the prediction capacity of the actual measurement value, compared to the residual capacity predicted by the conventional N-division accelerated lifespan evaluation method.

Likewise, according to the method of predicting the lifespan of a battery cell of the present invention, it is possible to improve the problem of generating a distorted result due to the accelerated storage degeneration in a specific capacity section when the conventional N-division accelerated lifespan evaluation method is applied to the battery cell of a high nickel positive electrode material.

The above description is merely illustrative of the technical idea of the present invention, and those skilled in the art to which the present invention pertains may make various modifications and variations without departing from the essential characteristics of the present invention. Therefore, the drawings disclosed in the present invention are not intended to limit the technical idea of the present invention but to describe the present invention, and the scope of the technical idea of the present invention is not limited by these drawings. The scope of protection of the present invention should be interpreted by the following claims, and all technical ideas within the scope equivalent thereto should be construed as being included in the scope of the present invention.

The invention claimed is:

1. A method for predicting a lifespan of a battery cell, comprising:
    virtually dividing a capacity of the battery cell, which is a measurement object for lifespan prediction, into two or more capacity parts;
    measuring charge and discharge cycle data for each of the capacity parts;
    correcting the charge and discharge cycle data by reflecting storage degeneration a positive electrode active material; and
    predicting a lifespan of the battery cell, based on the corrected charge and discharge cycle data,
    wherein the measuring the charge and discharge cycle data for each capacity part includes:
    determining a number of parts into which the capacity of the battery cell is to be virtually divided;
    preparing the battery cells as many as the number of parts; and
    measuring charge and discharge cycle data of the battery cells corresponding to the respective capacity parts by repeatedly charging and discharging the battery cells,
    wherein during the determining the number of parts and the preparing of the battery cells, the capacity parts of the battery cell are determined based on an output voltage to be matched to the divided parts.

2. The method of claim 1, wherein the correcting the charge and discharge cycle data includes:
    preparing actual battery cells as many as a double of a total number of the capacity parts;
    measuring a capacity according to storage time in a state that each of the actual battery cells is set to a predetermined voltage; and
    deriving storage degeneration for each of the capacity parts based on data obtained by the measurement.

3. The method of claim 2, wherein the predetermined voltage is a voltage which is measured at an ending time point of a rest period after charging and discharging up to an upper limit capacity and a lower limit capacity for each capacity part.

4. The method of claim 1, wherein during the determining the number of parts and the preparing of the battery cells, the capacity parts overlap with each other by a predetermined amount in an adjacent range.

5. The method of claim 1, wherein during the measuring the charge and discharge cycle data, the battery cells corresponding to the respective capacity parts are repeatedly charged and discharged, to thereby obtain charge and discharge cycle data of the battery cells.

6. The method of claim 5, wherein a scheme of charging and discharging the battery cells includes:
    determining a first reference voltage matched to an upper limit capacity among respective capacity parts corresponding to the battery cells;
    determining a second reference voltage matched to a lower limit capacity among respective capacity parts corresponding to the battery cells;
    measuring output voltages of the battery cells;
    comparing the output voltages with the first and second reference voltages; and
    determining whether to charge or discharge the battery cells based on a result of the comparing the output voltages with the first and second reference voltages.

7. The method of claim 6, wherein during the determining whether to charge or discharge the battery cells, if the output voltage of the battery cell is equal to or less than the first reference voltage, charging is performed, and if the output voltage of the battery cell exceeds the first reference voltage, charging is stopped, and discharging is performed.

8. The method of claim 6, wherein during the determining whether to charge or discharge the battery cells, if the output voltage of the battery cell is equal to or greater than the second reference voltage, discharging is performed, and if the output voltage of the battery cell is less than the second reference voltage, discharging is stopped, and charging is performed.

9. The method of claim 1, wherein during the predicting the lifespan of the battery cell, the lifespan of the battery cell is predicted by using one of:
    a first scheme of predicting the lifespan of the battery cell by adding charge and discharge cycle data for respective capacity parts reflecting the storage degeneration;
    a second scheme of predicting the lifespan of the battery cell with a combination sum of charge and discharge cycle data for respective capacity parts reflecting the storage degeneration; or
    a third scheme of predicting the lifespan of the battery cell using multiplicative probabilities of charge and discharge cycle data for respective capacity parts reflecting the storage degeneration.

* * * * *